United States Patent [19]
Atkinson

[11] Patent Number: 5,248,945
[45] Date of Patent: Sep. 28, 1993

[54] POWER AMPLIFIERS

[76] Inventor: Simon Atkinson, 36 Rectory Lane North, Leybourne, Kent ME19 5RA, England

[21] Appl. No.: 854,672
[22] PCT Filed: Sep. 3, 1991
[86] PCT No.: PCT/GB91/01488
§ 371 Date: Jul. 6, 1992
§ 102(e) Date: Jul. 6, 1992
[87] PCT Pub. No.: WO92/04768
PCT Pub. Date: Mar. 19, 1992

[30] Foreign Application Priority Data

Aug. 28, 1990 [GB] United Kingdom ............... 9019178

[51] Int. Cl.$^5$ ............... H03F 3/45; H04B 1/04
[52] U.S. Cl. ................... 330/252; 330/261; 455/114
[58] Field of Search ............... 307/490, 493, 494, 498; 330/110, 252, 254, 261; 455/112, 113, 114

[56] References Cited

U.S. PATENT DOCUMENTS 4,019,118  4/1977  Harwood ............... 330/252 X
4,965,528 10/1990  Okanobu ............... 330/261 X
5,033,110  7/1991  Harman ................ 455/114

Primary Examiner—Steven Mottola
Attorney, Agent, or Firm—Gerald E. Linden

[57] ABSTRACT

A power amplifier, especially for mobile radio systems, achieves high efficiency while maintaining stability by frequency translating the input signal during the power amplification process. Two class C amplifiers (q5,q6) have their outputs coupled together and have their inputs driven differentially. The transistors (q5,q6) are biassed for optimum efficiency and to ensure unsaturated class C operation.

8 Claims, 2 Drawing Sheets

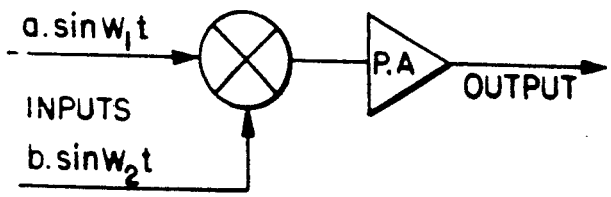
FIG. 1
PRIOR ART
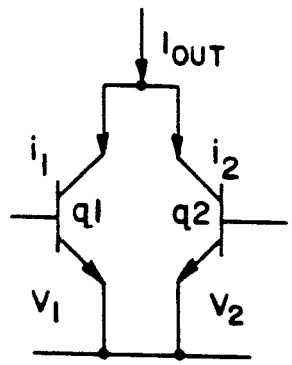
FIG. 2
PRIOR ART
FIG. 3
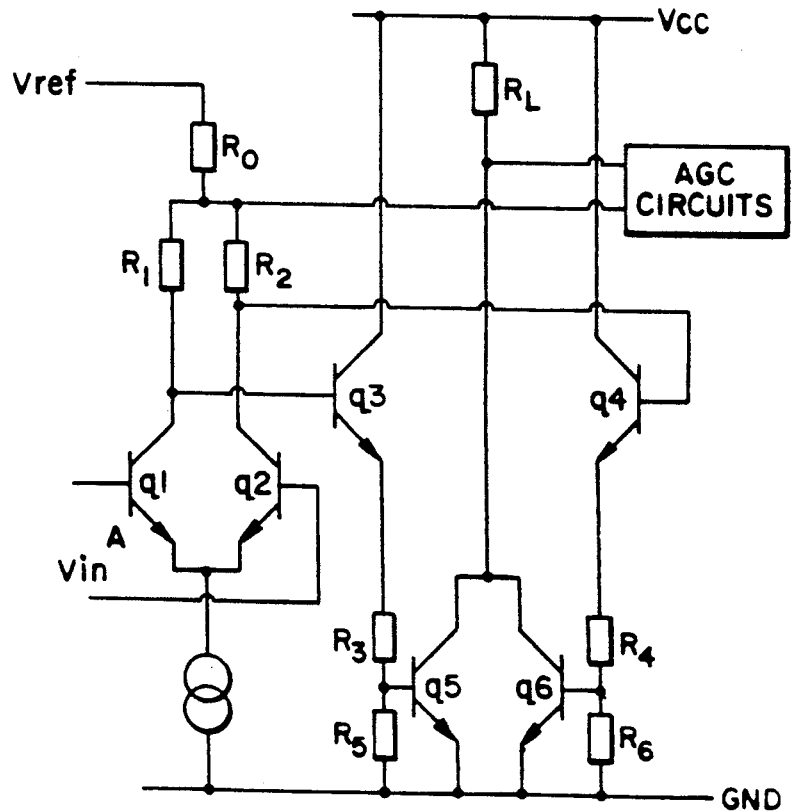
FIG. 4

POWER AMPLIFIERS

This invention relates to power amplifiers, and is particularly concerned with high efficiency, frequency doubling power amplifiers.

In modern mobile radio system transmitters, the requirement for high levels of integration makes it desirable to include a buffer (power) amplifier, that can drive an antenna directly, within the same silicon integration as other parts of the system. Examples of such systems that might require such a level of integration are the new CT2 system and the proposed DECT and PCN systems.

These amplifiers typically have to deliver power of between 1 mW and a few hundred mW into load impedances varying typically between 50 ohms and 200 ohms, at frequencies of up to 1.7 GHz. This makes the integration of such functions feasible, with the main problem being one of stability. The stability issue is particularly serious if both the input and the output of such functions are accessible externally to the chip via its associated package. This is because radiation across the package will necessarily allow a feedback path between the output and the input of the power amplifier, which may give rise to instability.

It is an object of the present invention to provide a power amplifier suitable for such applications which removes the problems of instability while maintaining the crucial requirement of high efficiency.

It is an object of the invention to achieve this by frequency translating the input signal during the power amplification process.

Traditionally this might have been achieved by applying a separate mixing function prior to the power amplifier as shown in FIG. 1, or by generating heavy distortion in the power amplifier and selecting, by filtering, a harmonic of the output as shown in FIG. 2. This does not however remove the problem that a large amount of power gain exists at a given frequency, on chip in the power amplifier, and in the latter case is very power inefficient.

In accordance with the present invention there is provided a power amplifier comprising two class C amplifiers having their outputs coupled together and having their inputs arranged to be driven differentially, whereby an input signal is frequency translated during the power amplification.

Preferably, the fundamental frequency of the input signal is suppressed at the output, and the fundamental frequency of the output signal is the second harmonic of the input signal.

In order that the invention may be more fully understood, one presently preferred embodiment of amplifier circuit will now be described by way of example and with reference to the accompanying drawings, in which:

FIGS. 1 and 2 show two known methods of frequency translation;

FIG. 3 shows the essential part of the power amplifier in accordance with the invention;

FIG. 4 shows a more complete circuit diagram of the power amplifier of FIG. 3.

Figure 5:
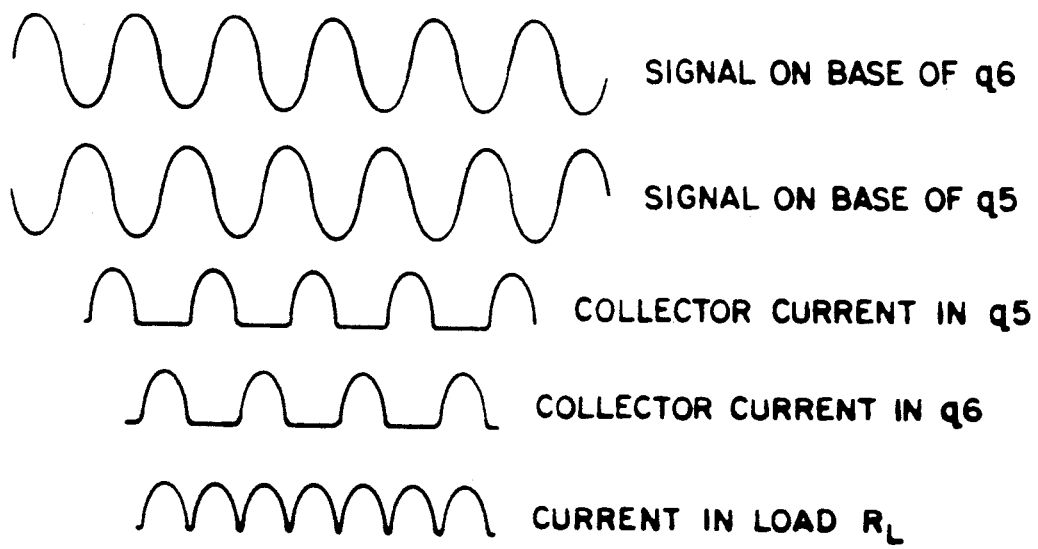
FIG. 5 shows the signals present at different points of the circuit of FIG. 4 in operation.

Referring first to FIG. 3, this shows two class C amplifiers comprising transistors q1 and q2 with their outputs coupled together and with their inputs driven differentially. The operation of this system can be explained mathematically as follows:

Assuming the large signal transconductance of a bipolar transistor is a good approximation to an exponential law:

$I = I_s e^{(v/vt)}$: where v is the applied voltage and $vt = (K_B T)/q$ $I + \delta I = I_s e^{(v + \delta v/vt)}$ $\delta I = I.(e^{(\delta v/vt)} - 1) = I\{-(\delta v/vt) + (\delta v/vt)^2 . \frac{1}{2}! + (\delta v/vt)^3 . \frac{1}{3}! + (\delta v/vt)^4 . \frac{1}{4}! + \ldots\}$ $i_1 = I_1.\{1 - (v_1/vt) + (v_1/vt)^2 . \frac{1}{2}! + (v_1/vt)^3 . \frac{1}{3}! + (v_1/vt)^4 . \frac{1}{4}! + (v_1/vt)^5 . 1/5! + \ldots\}$ $i_2 = I_2.\{1 - (v_2/vt) + (v_2/vt)^2 . \frac{1}{2}! + (v_2/vt)^3 . \frac{1}{3}! + (v_2/vt)^4 . \frac{1}{4}! + (v_2/vt)^5 . 1/5! + \ldots\}$ $i_1$ and $i_2$ are the signal currents in q1 and q2 arising from the input stimuli $v_1$ and $v_2$, where $I_1$ and $I_2$ are the D.C bias currents in q1 and q2 respectively.

If $I_1$ and $I_2$ are equal (identical biasing conditions) and $v_1 = -v_2 = v$ (differential signal), then:

$I_{out} = i_1 + i_2 = 2.I.\{1 + (v/vt)^2 . \frac{1}{2}! + (v/vt)^4 . \frac{1}{4}! + (v/vt)^2 . \frac{1}{2}! + (v/vt)^4 . \frac{1}{4}! + (v/vt)^6 . 1/6! + (v/vt)^8 . \frac{1}{8}! + \ldots\}$ If $v = a. \sin wt$ Then $I_{out} = 2.I.\{1 + a^2. \sin^2 wt/(2.vt^2) + a^4. \sin^4 wt/(24.vt^4) + a^6. \sin^6 wt/(720.vt^6) + \ldots\}$ It can now be clearly seen that the fundamental frequency of the input signal is suppressed at the output, and the fundamental frequency of the output signal is now the second harmonic of the input signal.

It should be noted that all of the power at the output goes into the second and higher order harmonics of the input. Hence the power efficiency is essentially as good as a class C amplifier without the problems of potential instability.

FIG. 4 shows a more complete implementation of the circuit. A differential or single-ended input signal is fed into an input port A. The input stage consists of a differential emitter coupled pair amplifier formed by the bipolar transistors q1 and q2 and resistors R1 and R2. The function of vref and resistor R0 is to provide a reference voltage whose level may be varied by the output current from the AGC (automatic gain control) circuits. This reference voltage along with resistors R1, R2, R3, R4, R5, R6 and transistors q3 and q4 sets up the bias conditions for a frequency doubling power stage, here formed by transistors q5 and q6. For optimum efficiency the bias condition on transistors q5 and q6 would be such that the quiescent standing current in the collectors would be small compared with the desired signal current to be delivered to the load $R_L$. This ensures that unsaturated class C operation occurs in both q5 and q6 when a sufficiently large signal is applied to their bases via the input gain stages and level shifting networks. As the D.C component of the output current is mainly a function of the output signal power, the AGC circuits will set up the operating conditions such that the current output power is delivered to the load $R_L$. A pictorial representation of the operation of the amplifier is shown in FIG. 5. The applied signal to both q5 and q6 biases them "on" during half of the cycle and biases them to cut off during the other half of the cycle.

I claim:

1. A frequency-doubling power amplifier consisting essentially of:
   a first transistor having a base, a collector and an emitter;
   a second transistor having a base, a collector and an emitter;
   the collector of the first transistor is connected to the collector of the second transistor;
   the emitter of the first transistor is connected to the emitter of the second transistor;
   the base of the first transistor is driven by an input voltage having a frequency;
   the base of the second transistor is differentially driven by the input voltage;
   the collectors of the first and second transistors deliver an output signal having a current to a load;
   the current of the output signal is at twice the frequency of the input voltage.

2. A frequency-doubling power amplifier, according to claim 1, further comprising:
   a third transistor having a base, a collector and an emitter;
   a fourth transistor having a base, a collector and an emitter;
   the third and the fourth transistors are connected as a differential emitter coupled pair amplifier with an input signal applied across the bases of the third and fourth transistors, the emitters of the third and fourth transistors connected to each other, the collector of the third transistor delivering the input voltage to the base of the first transistor in response to the input signal, and the collector of the fourth transistor delivering the differential input voltage to the base of the second transistor in response to the input signal.

3. Frequency-doubling power amplifier, according to claim 2, further comprising:
   a fifth transistor having a base, a collector and an emitter;
   a sixth transistor having a base, a collector and an emitter;
   the fifth transistor connected between the collector of the third transistor and the base of the first transistor;
   the sixth transistor connected between the collector of the fourth transistor and the base of the second transistor.

4. Frequency-doubling power amplifier, according to claim 3, further comprising:
   means for providing a reference voltage;
   a plurality of biassing resistors;
   whereby the reference voltage, the biassing resistors, the fifth transistor and the sixth transistor set up bias conditions for the first and second transistors.

5. Frequency-doubling power amplifier, according to claim 1, wherein:
   the input voltage on the base of the first transistor is 180 degrees out of phase with the input voltage on the base of the second transistor.

6. A frequency-doubling power amplifier, according to claim 2, wherein:
   the input signal has a first fundamental frequency and second and higher order harmonics;
   the output signal has a second fundamental frequency; and
   the first fundamental frequency of the input signal is suppressed at the collectors of the first and second transistors, and the second fundamental frequency of the output signal is the second harmonic of the input signal.

7. A frequency-doubling power amplifier, according to claim 2, wherein:
   the output signal has a power associated therewith; and
   substantially all of the power of the output signal is in the second and higher order harmonics of the input signal.

8. A frequency-doubling power amplifier, according to claim 1, further comprising:
   means for biassing the first and second transistors to ensure their unsaturated class C operation.

* * * * *